US008829943B2

(12) United States Patent
Kumar

(10) Patent No.: US 8,829,943 B2
(45) Date of Patent: Sep. 9, 2014

(54) LOW SUPPLY VOLTAGE ANALOG DISCONNECTION ENVELOPE DETECTOR

(71) Applicant: STMicroelectronics International N.V., Amsterdam (NL)

(72) Inventor: Daljeet Kumar, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 42 days.

(21) Appl. No.: 13/656,079

(22) Filed: Oct. 19, 2012

(65) Prior Publication Data

US 2014/0111248 A1     Apr. 24, 2014

(51) Int. Cl.
H03K 5/153     (2006.01)

(52) U.S. Cl.
USPC ............................................ 327/77; 327/65

(58) Field of Classification Search
USPC .................. 327/65, 77, 79, 82, 90, 18–21, 66
See application file for complete search history.

(56) References Cited

U.S. PATENT DOCUMENTS

| | | | |
|---|---|---|---|
| 5,973,515 A * | 10/1999 | Marbot et al. | 327/65 |
| 6,239,652 B1 * | 5/2001 | Oh et al. | 327/541 |
| 7,199,620 B2 * | 4/2007 | Ishizuka et al. | 327/65 |
| 7,327,106 B1 * | 2/2008 | Rana et al. | 318/400.34 |
| 7,358,776 B2 * | 4/2008 | Matsumoto | 327/18 |
| 7,397,269 B2 * | 7/2008 | Ishibashi et al. | 326/14 |
| 7,747,807 B2 * | 6/2010 | Komatsu et al. | 710/301 |
| 2006/0132192 A1 * | 6/2006 | Yu | 327/65 |
| 2011/0050330 A1 * | 3/2011 | Miki et al. | 327/539 |

* cited by examiner

Primary Examiner — Quan Tra
(74) Attorney, Agent, or Firm — Gardere Wynne Sewell LLP

(57) ABSTRACT

An analog disconnection envelope detection circuit having a low power supply detects a high speed, high differential voltage disconnect state on a data line. Level-shifting circuitry shifts the voltage level of two input signals by the value of a detection threshold voltage, generates differential signals used to indicate conditions of the input signals, and mitigates effects of input differential signal common-mode voltage on the detection operation. Circuitry is provided to equalize VDS of detecting tail current sources, thereby eliminating errors resulting from VDS mismatch of tail current sources. Comparator circuitry compares the sets of differential signals and indicates when the absolute difference between the two input signals is greater than a reference voltage. Output circuitry generates a disconnect signal corresponding to the disconnect condition. When compared to conventional disconnect detection circuitry, the disclosed circuit utilizes a relatively low supply voltage to detect high differential voltage disconnect conditions with improved accuracy.

21 Claims, 4 Drawing Sheets

US 8,829,943 B2

LOW SUPPLY VOLTAGE ANALOG DISCONNECTION ENVELOPE DETECTOR

FIELD OF THE INVENTION

This invention generally relates to circuitry implemented in the analog front end of high speed serial communication circuitry and, more particularly, to analog disconnect detection circuitry.

BACKGROUND

Conventional analog disconnect detection circuitry is typically implemented in the analog front end of high speed serial communication circuitry such as, for example, that defined in accordance with USB standard 2.0, to detect a high speed disconnect state on a data line. An example embodiment of conventional analog disconnect detection circuitry includes level-shifting circuitry, comparator circuitry and output circuitry. The level-shifting circuitry generally shifts the voltage level of two input signals by the value of a detection threshold, generates two sets of differential signals, and mitigates the effect of input differential signal common-mode voltage on the detection operation. The comparator circuitry generally compares each set of differential signals generated by the level-shifting circuitry and produces signals indicating when the absolute difference between the two input signals is greater than a reference voltage. Finally, the output circuitry generates a disconnect signal corresponding to an absolute disconnect condition, thereby signaling detection of the disconnection state.

The conventional analog disconnect detection circuit operates with a supply voltage that, when compared to the input detection threshold voltage, is relatively large. However, when the supply voltage is reduced, performance of the conventional analog disconnect detection circuitry is significantly degraded. Accordingly, the conventional analog disconnect detection circuitry is limited to implementations in which the supply voltage is relatively large with respect to the input detection threshold voltage. Furthermore, analog disconnect detection circuits implemented with high supply voltages typically utilize thick gate oxide transistors to mitigate reliability issues. The use of thick gate oxide transistors obstruct efforts to streamline the analog disconnect detection circuits for application in SOC platforms where thick gate oxide devices are not supported.

SUMMARY

The present disclosure provides a low voltage analog disconnection envelope detection circuit operable to detect a high speed disconnect state on a data line. In one embodiment, the disconnect detection circuit comprises: a first input transistor coupled to receive a first input signal; a second input transistor coupled to receive a second input signal; regulating circuitry operable to produce a regulated voltage for controlling a plurality of current sources to generate a first set of differential signals indicative of a disconnect condition, the plurality of current sources including a first source transistor and a second source transistor, wherein the second source transistor is coupled to the second input transistor; a resistance coupled between the first source transistor and the first input transistor; and logic circuitry operable to process the first set of differential signals to generate a disconnect signal.

In another embodiment, the disconnect detection circuit comprises: sensing circuitry operable to receive a first input signal and a second input signal, the sensing circuitry including a pair of first input transistors, each operable to receive the first input signal, and a pair of second input transistors, each operable to receive the second input signal; current sourcing circuitry comprising a pair of first source transistors, each coupled to respective ones of the first input transistors, and a pair of second source transistors, each coupled to respective ones of the second input transistors; regulating circuitry operable to produce a regulated voltage for controlling the current sourcing circuitry to generate a first set of differential signals indicative of a first disconnect condition and a second set of differential signals indicative of a second disconnect condition; and logic circuitry operable to process the first and second sets of differential signals to generate a disconnect signal.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE EMBODIMENTS

The present disclosure provides an analog disconnection envelope detection circuit operable to detect a high speed disconnect state on a data line. When compared to conventional analog disconnect detection circuitry, the disclosed circuit is capable of utilizing a relatively low supply voltage to detect high differential voltage disconnect conditions with improved accuracy. In some embodiments, the disclosed analog disconnection envelope detection circuit may be incorporated in the analog front end of high speed serial communication circuitry such as, for example, that defined in accordance with USB standard 2.0.

Figure 1A:
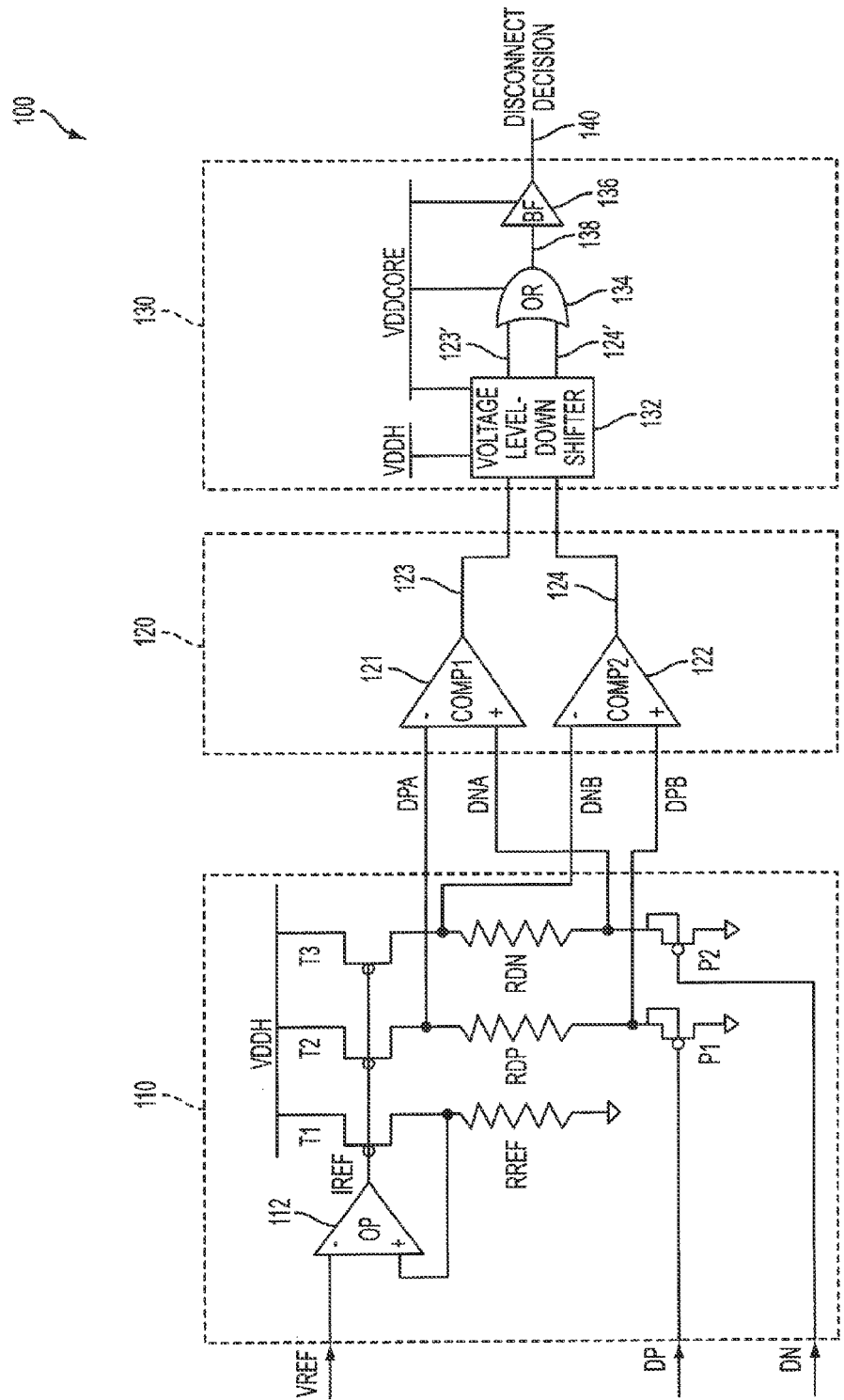
FIG. 1A illustrates an embodiment of an analog disconnect detection circuit.

FIG. 1A illustrates an embodiment of an analog disconnect detection circuit 100. The analog disconnect detection circuit 100 includes level-shifting circuitry 110, comparator circuitry 120 and output circuitry 130. The level-shifting circuitry 110 includes an operational amplifier 112 operable to drive the control terminals (gates) of PMOS transistors T1, T2 and T3 (also referred to herein as tail current sources), which receive supply voltage VDDH at their sources, and are coupled at their drains to resistors RREF, RDP and RDN, respectively. The operational amplifier 112 receives a detection threshold voltage VREF and a negative feedback input coupled between the drain of transistor T1 and resistor RREF. The operational amplifier 112 biases the tail current sources T1-T3 at reference current Iref, which is related to a regulated voltage produced by the amplifier 112. In some embodiments, resistors RREF, RDP and RDN are of the same value so that the voltage drop across these resistors is equal to the detection threshold voltage VREF.

The level-shifting circuitry 110 also includes PMOS transistors P1 and P2, which receive respective input signals DP and DN at their control terminals (gates), respectively, and are coupled, at their sources, to resistors RDP and RDN, respectively. Transistors P1 and P2 are substantially equal in size and operate in a source follower configuration biased with the reference current Iref.

The level-shifting circuitry 110 shifts the voltage level of the two input signals DP and DN by the value of the detection threshold VREF, and generates first and second sets of differential input signals. The first set of differential signals DPA and DNA are generated at the drain of transistor T2 and the source of transistor P2, respectively, and are used to detect a first condition of a disconnect state wherein V(DN)−V(DP)>VREF. The second set of differential signals DPB and DNB are generated at the source of transistor P1 and the drain of transistor T3, respectively, and are used to detect a second condition of a disconnect state wherein V(DP)−V(DN)>VREF.

The comparator circuitry 120 includes a first comparator 121 and a second comparator 122. The first comparator 121 receives the first set of differential signals DPA and DNA and produces a first comparator signal 123. When DNA is greater than DPA, the first comparator signal 123 goes logic high (VDDH), thereby indicating that the first condition for detecting a disconnect state is satisfied (i.e., when V(DN)−V(DP)>VREF, or V(DN)>V(DP)+VREF). Similarly, the second comparator 122 receives the second set of differential signals DPB and DNB and produces a second comparator signal 124. When DPB is greater than DNB, the second comparator signal 124 goes logic high (VDDH), thereby indicating that the second condition for detecting a disconnect state is satisfied (i.e., when V(DP)−V(DN)>VREF, or V(DP)>V(DN)+VREF).

The output circuitry 130 includes a voltage level down-shifting circuit 132, OR logic gate 134, and buffer 136 and generates a disconnect signal 140 corresponding to an absolute disconnect condition to signal detection of the disconnection state. The voltage level down-shifting circuit 132 receives the first and second comparator signals 123 and 124 and shifts the logic high voltage of comparator signals 123 and 124 from VDDH to VDDCORE to produce shifted signals 123' and 124', which are applied to the inputs of OR logic gate 134. The OR logic gate 134 produces an output logic signal 138 that goes high when either of the first or second comparator signals 123 or 124 is logic high. In other words, logic signal 138 is high when the absolute difference between the two input signals DP and DN is greater than the reference voltage VREF (i.e., when |V(DP)−V(DN)|>VREF), thereby indicating that the input signals DP and DN correspond to a disconnection condition. The buffer 136 receives the logic signal 138 and produces the disconnect signal 140.

Figure 1B:
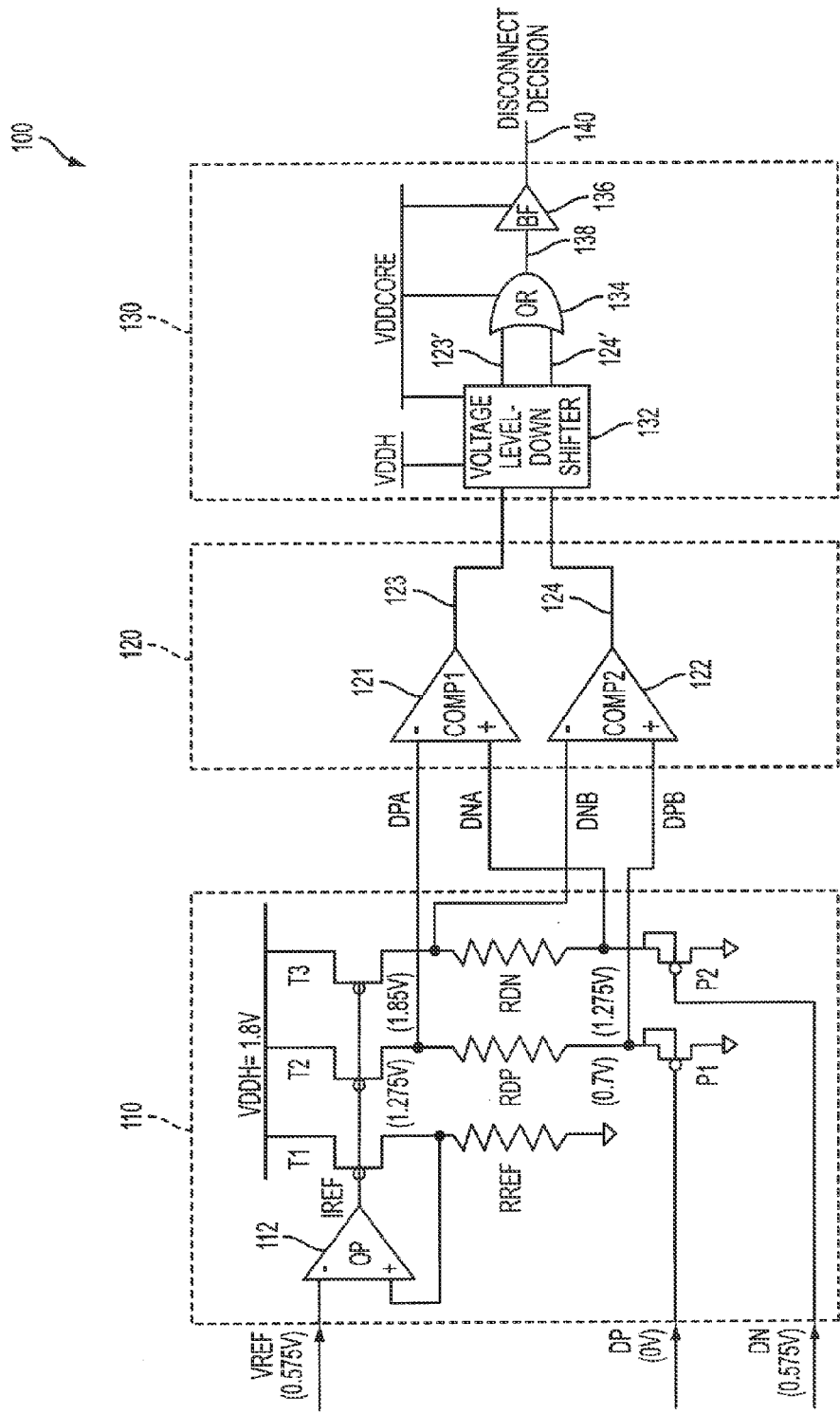
FIG. 1B illustrates an embodiment of the analog disconnect detection circuit of FIG. 1A corresponding to the specifications of USB 2.0.

The analog disconnect detection circuit 100 operates properly when the supply voltage VDDH (e.g., 2.5V or 3.3V) is relatively large (for example, approximately four or five times larger) when compared to the detection threshold voltage VREF (e.g., 0.575V). However, in embodiments utilizing a lower supply voltage for VDDH, performance of the circuit degrades significantly. For example, FIG. 1B illustrates an embodiment in which the analog disconnect detection circuit 100 is implemented with a lower supply voltage VDDH of about 1.8V. As described below, the embodiment illustrated in FIG. 1B implements a 1.8V supply voltage VDDH, which is the supply voltage generally used for high speed circuitry such as, for example, high speed circuitry defined in accordance with USB standard 2.0. Pursuant to USB 2.0 specifications, disconnection is indicated when the amplitude of the differential signal at the driver's connector is greater than or equal to 625 mV, and is not indicated when the differential signal amplitude is less than or equal to 525 mV. The analog disconnect detection circuit 100 of FIG. 1B has a design range of 100 mV for detecting a disconnect condition. In order to efficiently detect a disconnect condition for the current embodiment, the detection threshold is set at the middle voltage of the design range; thus, VREF is set to 575 mV.

In the embodiment of the circuit 100 illustrated in FIG. 1B, the first differential input signal DP is set to 0V and the second differential input signal DN is set to 0.575V. Accordingly, the circuit 100 corresponds to a detection state wherein the input differential between the two input signals DP and DN is equal to the detection threshold of 0.575V. Assuming a VGS of 0.7V for transistors P1 and P2, the differential signal sets DPA, DNA, DPB and DNB should, during the detection state, have voltages of approximately 1.275V, 1.275V, 0.7V and 1.85V, respectively, as shown in FIG. 1B. However, the supply voltage VDDH is approximately 1.8V, and the large voltage of DNB (1.85V) at the drain of transistor T3 pushes transistor T3 into the linear region. Transistor T3 provides the tail current source for DNA and DNB, so when transistor T3 enters the linear region, the tail current is reduced, and the voltages of DNA and DNB are decreased.

Although the DNB voltage is decreased, it remains greater than the DPB voltage (0.7V), so the second comparator 122 remains in a fixed state producing a low second comparator signal 124; therefore, in the present embodiment, the first comparator signal 123 produced by the first comparator 121 will determine detection of the disconnection condition. Unfortunately, when transistor T3 enters the linear region, the voltage of DNA falls well below the desired detection value of 1.275V. When the DNA voltage is too low, the first comparator 121 is unable to detect the first condition (i.e., when V(DN)−V(DP)>VREF, or V(DN)>V(DP)+VREF), and the circuit 100 is unable to detect a disconnection condition for the differential voltage of 0.575V. Accordingly, a larger input differential voltage is needed (assuming the supply voltage VDDH remains unchanged) to increase DNA to a voltage greater than DPA to trigger the first comparator 121 and detect the disconnect condition. In view of the foregoing, the analog disconnect detection circuit illustrated in FIGS. 1A and 1B is unable to properly detect a disconnect condition when the supply voltage is relatively low with respect to the detection threshold voltage.

Figure 2A:
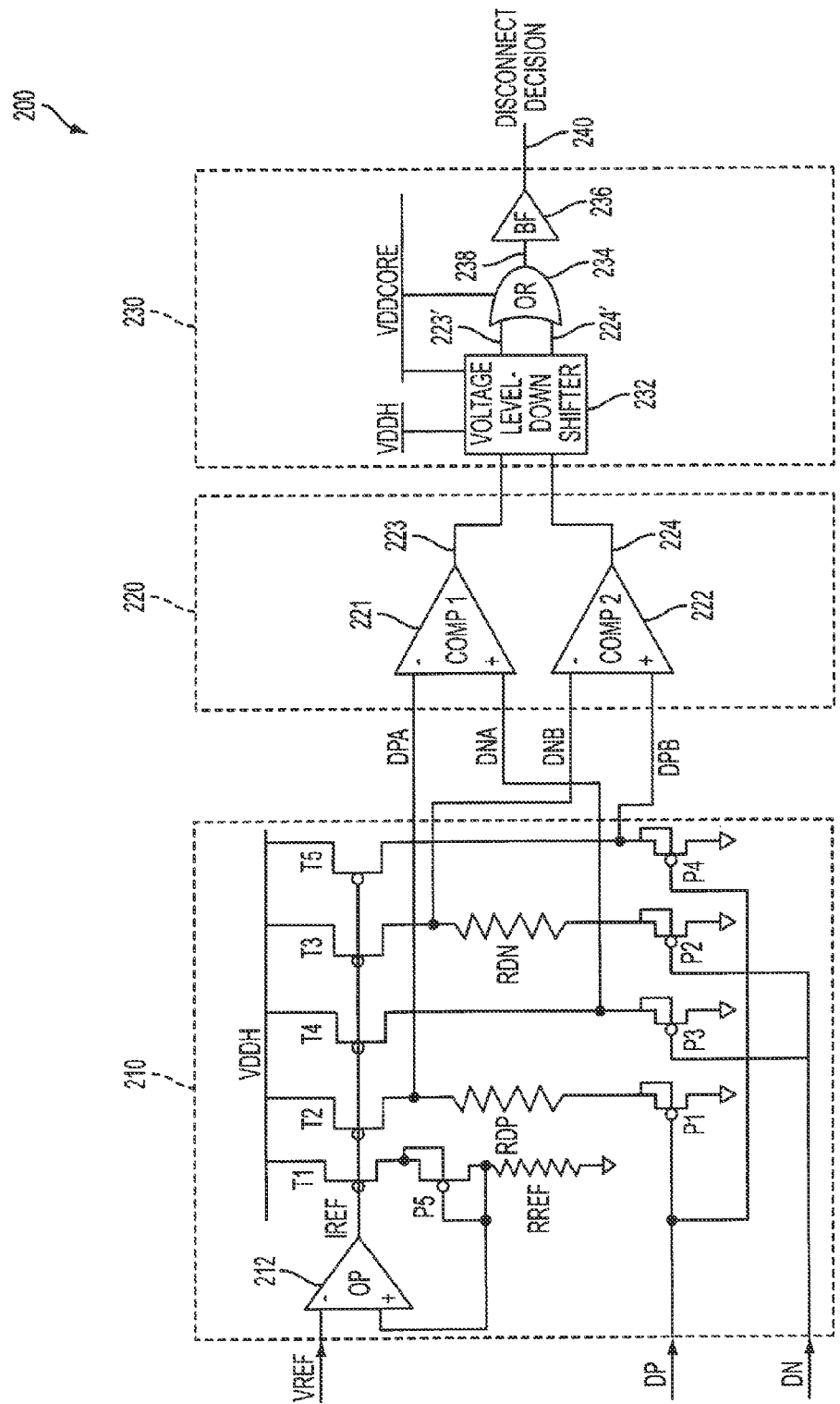
FIG. 2A illustrates an analog disconnection envelope detection circuit.

Reference is now made to FIG. 2A, which illustrates an embodiment of an analog disconnection envelope detection circuit 200. The analog disconnection envelope detection circuit 200 is similar in some regards to the detection circuit 100 in FIGS. 1A and 1B. For example, the analog disconnection envelope detection circuit 200 includes level-shifting circuitry 210, comparator circuitry 220 and output circuitry 230. As shown in FIG. 2A, the level-shifting circuitry 210 includes an operational amplifier 212 operable to receive a detection threshold voltage VREF and a negative feedback input. The amplifier 212 drives the control terminals (gates) of transistors T1, T2, T3, T4 and T5 (also referred to herein as tail current sources), which receive a relatively low supply voltage VDDH (for example, on the order of 1.8V) at their sources. Transistors T2 and T3 are coupled at their drains to resistors RDP and RDN, respectively. In the embodiment illustrated in FIG. 2A, the amplifier 212 biases the tail current sources T1-T5 at reference current Iref, which is related to a regulated voltage produced by the amplifier 212. In some embodiments, resistors RREF, RDP and RDN are of the same value so that the voltage drop across these resistors is substantially equal to the detection threshold voltage VREF.

The level-shifting circuitry 210 also includes transistors P1, P2, P3, P4 and P5 (P5 is optional in some embodiments) biased with the reference current Iref. Transistors P1-P4 operate in a source follower configuration, wherein transistors P1 and P4 receive a first input differential signal DP at their control terminals (gates), and transistors P2 and P3 receive a second input differential signal DN at their control terminals (gates). As shown in FIG. 2A, the sources of transistors P1 and P2 are coupled to resistors RDP and RDN, respectively, the sources of transistors P3, P4 and P5 are coupled to the drains of transistors T4, T5 and T1, respectively, and the gate and drain of transistor P5 are coupled between the negative feedback input of the amplifier 212 and resistor RREF. In some embodiments, transistor P5 is optional. In embodiments incorporating transistor P5, transistor P5 is provided to equalize the VDS of the detecting tail current sources (transistors T1-T5) thereby eliminating errors that occur as a result of VDS mismatch. Additionally, in some embodiments, transistor P5 is substantially equal in size to transistors P1-P4 so that the VGS drop across transistor P5 is substantially equal to the VGS drop across each of transistors P1-P4.

The level-shifting circuitry 210 shifts the voltage level of the two input signals DP and DN by the value of the detection threshold VREF, and generates first and second sets of differential input signals. The first set of differential input signals DPA and DNA are generated at the drain of transistor T2 and the source of transistor P3 (or the drain of T4), respectively, and are used to detect a first condition of a disconnect state wherein V(DN)−V(DP)>VREF. The second set of differential input signals DNB and DPB are generated at the drain of transistor T3 and the source of transistor P4 (or drain of transistor T5), respectively, and are used to detect a second condition of a disconnect state wherein V(DP)−V(DN)>VREF. In some embodiments, the level-shifting circuitry 210 mitigates the effect of input differential signal common-mode voltage on the detection operation.

The comparator circuitry 220 includes a first comparator 221 and a second comparator 222. The first comparator 221 receives the first set of differential signals DPA and DNA and produces a first comparator signal 223. When DNA is greater than DPA, the first comparator signal 223 goes logic high (VDDH), thereby indicating that the first condition for detecting a disconnect state is satisfied (i.e., when V(DN)−V(DP)>VREF, or V(DN)>V(DP)+VREF). Similarly, the second comparator 222 receives the second set of differential signals DPB and DNB and produces a second comparator signal 224. When DPB is greater than DNB, the second comparator signal 224 goes logic high (VDDH), thereby indicating that the second condition for detecting a disconnect state is satisfied (i.e., when V(DP)−V(DN)>VREF, or V(DP)>V(DN)+VREF).

The output circuitry 230 includes a voltage level down-shifting circuit 232, OR logic gate 234, and buffer 236 and generates a disconnect signal 240 corresponding to an absolute disconnect condition to signal detection of the disconnection state. The voltage level down-shifting circuit 232 receives the first and second comparator signals 223 and 224, and shifts the logic high voltage of comparator signals 223 and 224 from VDDH to VDDCORE to produce shifted signals 223' and 224', which are applied to the inputs of OR logic gate 234. The OR logic gate 234 produces an output logic signal 238 that goes high when either of the first or second comparator signals 223 or 224 is logic high. In other words, logic signal 238 is high when the absolute difference between the two input signals DP and DN is greater than the reference voltage VREF (i.e., when |V(DP)−V(DN)|>VREF), thereby indicating that the input signals DP and DN correspond to a disconnection condition. The buffer 236 receives the logic signal 238 and produces the disconnect signal 240.

The analog disconnection envelope detection circuit 200 operates similar to the detection circuit 100 of FIGS. 1A and 1B; however, modifications to the level-shifting circuitry 210 allow the circuit 200 to properly perform disconnect envelope detection with a relatively low supply voltage for VDDH by maintaining operation of the detection transistors (transistors T1-T5) well within the saturation region. For example, as shown in the analog disconnection envelope detection circuit 200 of FIG. 2A, the differential input signals DNA and DPB are biased by transistors T4 and T5, respectively, operating in the saturation region when biased at the switching point (or detection point). Additionally, transistor P5 is provided, in some embodiments, to eliminate VDS mismatch of the tail current sources (T2, T4) and (T3, T5) with respect to reference tail current source T1, thereby providing a substantially constant VDS across tail current source transistors T1, T2 and T4 when detecting the first condition (i.e., when V(DN)−V(DP)>VREF, or V(DN)>V(DP)+VREF) and also providing a substantially constant VDS across tail current source transistors T1, T3 and T5 when detecting the second condition (i.e., when V(DP)−V(DN)>VREF, or V(DP)>V(DN)+VREF).

Figure 2B:
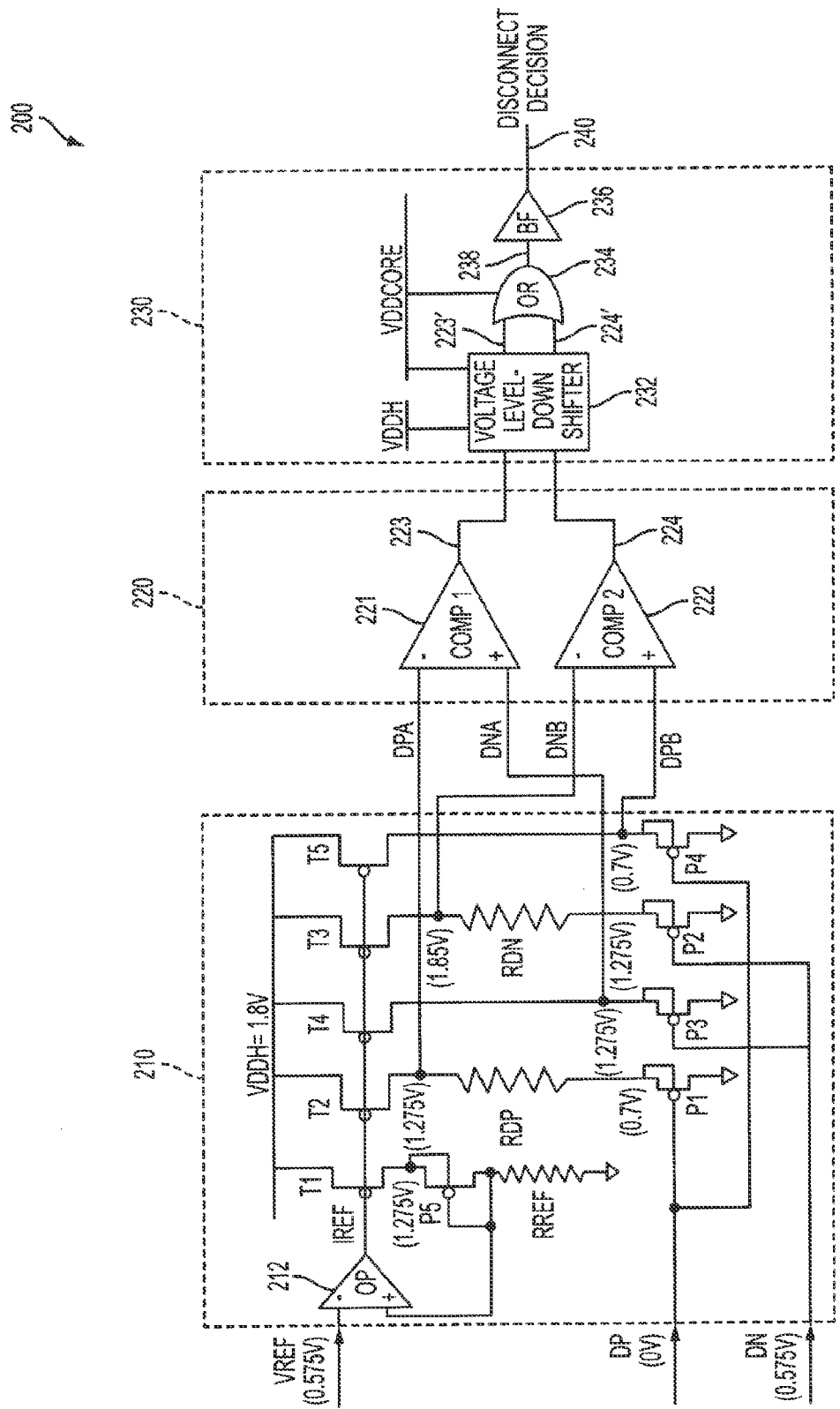
FIG. 2B illustrates an embodiment of the analog disconnection envelope detection circuit of FIG. 2A corresponding to the specifications of USB 2.0.

FIG. 2B illustrates an embodiment in which the analog disconnection envelope detection circuit 200 is implemented with a 1.8V supply voltage VDDH, which is the supply voltage generally used for high speed circuitry such as, for example, high speed circuitry defined in accordance with USB standard 2.0. Pursuant to USB 2.0 specifications, disconnection is indicated when the amplitude of the differential signal at the driver's connector is greater than or equal to 625 mV, and is not indicated when the differential signal amplitude is less than or equal to 525 mV. The analog disconnection envelope detection circuit 200 of FIG. 2B has a design range of 100 mV for detecting a disconnect condition. In order to efficiently detect the disconnect condition for the current embodiment, the detection threshold is set to the middle voltage of the design range; thus, VREF is set to 575 mV.

In the embodiment of the circuit 200 illustrated in FIG. 2B, the first differential input signal DP is 0V and the second differential input signal DN is 0.575V. Accordingly, the circuit 200 corresponds to a detection state wherein the input differential between the two input signals DP and DN is equal to the detection threshold of 0.575V. Assuming a VGS of 0.7V for transistors P1-P5, the differential signal sets DPA, DNA, DPB and DNB should, at the point of detection, have voltages of approximately 1.275V, 1.275V, 0.7V and 1.85V, respectively, as shown in FIG. 2B. The large voltage of DNB (1.85V) pushes transistor T3 into the linear region. Transistor T3 provides the tail current source for DNB, so when transistor T3 enters the linear region, the tail current is reduced, and the voltage of DNB decreases. Nevertheless, the DNB voltage remains greater than the DPB voltage (0.7V), and the second comparator 222 remains in a fixed state producing a low second comparator signal 224. Accordingly, in the embodiment illustrated in FIG. 2B, the first comparator signal 223 produced by the first comparator 221 determines the detection of the disconnection state.

In the embodiment illustrated in FIG. 2B, the signals used to control the first comparator 221 (i.e., DPA and DNA) are driven by transistors T2 and T4, which are operating in saturation mode and, therefore, are not affected by transistor T3 operating in the linear region. Additionally, tail current sources T1, T2 and T4 have the same VDS voltage (1.275V) during the detection state, and are therefore free of VDS mismatches. Accordingly, the input differential signals DPA and DNA are error free, and the first comparator 221 is able to properly detect the disconnection condition for the 0.575V detection threshold voltage VREF, even when the supply voltage is relatively low.

It should be appreciated that the various embodiments disclosed herein are exemplary. Accordingly, various modifications to these embodiments may be made without departing from the scope of the present disclosure and the claims provided below. For example, although the disclosure is generally directed to a low supply voltage analog disconnect envelope detection application for detecting high differential voltage disconnect conditions, the disclosure may apply to other applications as well.

What is claimed is:

1. A disconnect detection circuit, comprising:
    a first input transistor coupled to receive a first input signal;
    a second input transistor coupled to receive a second input signal;
    regulating circuitry operable to produce a regulated voltage for controlling a plurality of current sources, the plurality of current sources including a first source transistor and a second source transistor, wherein a source-drain path of the second source transistor is directly connected to a source-drain path of the second input transistor;
    a resistor coupled in series between a source-drain path of the first source transistor and a source-drain path of the first input transistor; and
    circuitry operable to compare a first signal generated at a first node where the source-drain path of the first source transistor is coupled in series with the resistor to a second signal generated at a second node where the source-drain paths of the second source transistor and second input transistor are directly connected and generate a disconnect signal in response to the comparison.

2. The disconnect detection circuit as set forth in claim 1, wherein the circuitry comprises comparator circuitry operable to compare the first and second signals and to produce a first comparison signal indicating a first disconnect condition.

3. The disconnect detection circuit as set forth in claim 2, wherein the first disconnect condition occurs when the second input signal is greater than a sum of the first input signal and the regulated voltage produced by the regulating circuitry.

4. The disconnect detection circuit as set forth in claim 2, wherein the first disconnect condition occurs when the first input signal is greater than a sum of the second input signal and the regulated voltage produced by the regulating circuitry.

5. The disconnect detection circuit as set forth in claim 2, wherein the circuitry further comprises voltage level shifting circuitry operable to shift a voltage level of the first comparison signal.

6. The disconnect detection circuit as set forth in claim 5, wherein the circuitry further comprises a logic gate operable to receive the voltage-level-shifted version of the first comparison signal and generate the disconnect signal.

7. The disconnect detection circuit as set forth in claim 1, further comprising:
    a regulation transistor having a control terminal connected to control terminals of the plurality of current sources;
    a diode-connected transistor coupled in series with a source-drain path of the regulation transistor and configured to substantially eliminate a voltage mismatch among the plurality of current sources.

8. The disconnect detection circuit as set forth in claim 1, wherein the disconnect detection circuit is further operable to perform a voltage level shift of the first and second input signals.

9. The disconnect detection circuit as set forth in claim 8, wherein the voltage level shift is substantially equal to the regulated voltage produced by the regulating circuitry.

10. The disconnect detection circuit as set forth in claim 1, wherein the disconnect detection circuit receives a supply voltage, wherein the supply voltage is at least four times greater than a reference voltage received at the regulating circuitry.

11. The disconnect detection circuit as set forth in claim 1, wherein the plurality of input transistors operate in a source follower configuration biased with a reference current generated by the regulating circuitry.

12. A disconnect detection circuit, comprising:
    sensing circuitry operable to receive a first input signal and a second input signal, the sensing circuitry including first and second input transistors, each operable to receive the first input signal, and third and fourth input transistors, each operable to receive the second input signal;
    current sourcing circuitry comprising first and second source transistors having source-drain paths directly connected in series to source-drain paths of the first and third input transistors, respectively, and third and fourth source transistors having source-drain paths each coupled in series through a resistor to source-drain paths of the second and fourth input transistors, respectively;
    regulating circuitry operable to produce a regulated voltage for controlling the current sourcing circuitry to generate a first set of differential signals output from the first and fourth source transistors and a second set of differential signals output from the second and third source transistors; and
    circuitry operable to process the first and second sets of differential signals to generate a disconnect signal.

13. The disconnect detection circuit as set forth in claim 12, wherein the regulating circuitry comprises an additional source transistor having a drain terminal coupled in series to a diode-connected transistor, the diode-connected transistor operable to substantially eliminate a voltage mismatch among at least the additional source transistor, one of the first and second source transistors, and one of the third and fourth source transistors.

14. The disconnect detection circuit as set forth in claim 12, wherein a first resistor is connected at a drain terminal of the third source transistor to generate a signal of the first set of differential signals, and a second resistor is connected at a drain terminal of the fourth source transistor to generate a signal of the second set of differential signals.

15. The disconnect detection circuit as set forth in claim 12, wherein the circuitry comprises first comparator circuitry operable to compare the first set of differential signals and to produce a first comparison signal indicating a first disconnect condition, and second comparator circuitry operable to compare the second set of differential signals and to produce a second comparison signal indicating a second disconnect condition.

16. The disconnect detection circuit as set forth in claim 15, wherein the logic circuitry further comprises voltage level shifting circuitry operable to shift a voltage level of at least one of the first and second comparison signals.

17. The disconnect detection circuit as set forth in claim 16, wherein the logic circuitry further comprises a logic gate operable to receive the voltage-level-shifted version of at least one of the first and second comparison signals and generate the disconnect signal.

18. The disconnect detection circuit as set forth in claim 12, wherein the disconnect signal indicates a disconnect condition when the second input signal is greater than a sum of the first input signal and the regulated voltage produced by the regulating circuitry.

19. The disconnect detection circuit as set forth in claim 12, wherein the disconnect signal indicates a disconnect condition when the first input signal is greater than a sum of the second input signal and the regulated voltage produced by the regulating circuitry.

20. The disconnect detection circuit as set forth in claim 12, wherein the current sourcing circuitry receives a supply voltage, wherein the supply voltage is at least four times greater than a reference voltage received at the regulating circuitry.

21. A circuit, comprising:
  an amplifier having first and second inputs and an output, the first input configured to receive a reference voltage;
  a first source transistor having a gate coupled to the output of the amplifier and a drain coupled to the second input of the amplifier;
  a second source transistor having a gate coupled to the output of the amplifier;
  a third source transistor having a gate coupled to the output of the amplifier;
  a first input transistor having a gate coupled to receive a first input signal and a source-drain path directly connected in series with a source-drain path of the second source transistor;
  a second input transistor having a gate coupled to receive a second input signal and a source-drain path;
  a resistor couple in series between the source-drain path of the second input transistor and a source-drain path of the third source transistor; and
  a comparator having a first input coupled to a drain of the second source transistor and a second input coupled to a drain of the third source transistor.

* * * * *